(12) United States Patent
Tsai et al.

(10) Patent No.: US 12,166,078 B2
(45) Date of Patent: Dec. 10, 2024

(54) CONTACT STRUCTURE FOR SEMICONDUCTOR DEVICE AND METHOD

(71) Applicant: Taiwan Semiconductor Manufacturing Company, Ltd., Hsinchu (TW)

(72) Inventors: Yan-Ming Tsai, Toufen Township (TW); Chih-Wei Chang, Hsinchu (TW); Ming-Hsing Tsai, Chu-Pei (TW); Sheng-Hsuan Lin, Zhubei (TW); Hung-Hsu Chen, Tainan (TW); Wei-Yip Loh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/663,458

(22) Filed: May 16, 2022

(65) Prior Publication Data

US 2022/0278199 A1 Sep. 1, 2022

Related U.S. Application Data

(62) Division of application No. 16/656,836, filed on Oct. 18, 2019, now Pat. No. 11,335,774.

(51) Int. Cl.
| | |
|---|---|
| *H01L 29/08* | (2006.01) |
| *H01L 21/02* | (2006.01) |
| *H01L 21/8238* | (2006.01) |
| *H01L 27/092* | (2006.01) |
| *H01L 29/66* | (2006.01) |
| *H01L 29/78* | (2006.01) |

(52) U.S. Cl.
CPC .... *H01L 29/0847* (2013.01); *H01L 21/02153* (2013.01); *H01L 21/823814* (2013.01); *H01L 21/823821* (2013.01); *H01L 21/823871* (2013.01); *H01L 21/823878* (2013.01); *H01L 27/0924* (2013.01); *H01L 29/66795* (2013.01); *H01L 29/785* (2013.01)

(58) Field of Classification Search
CPC ......... H01L 21/28518; H01L 29/41791; H01L 27/0924; H01L 21/823814; H01L 21/823821
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |

(Continued)

*Primary Examiner* — Samuel A Gebremariam
*Assistant Examiner* — Jonas T Beardsley
(74) *Attorney, Agent, or Firm* — Slater Matsil, LLP

(57) ABSTRACT

A device includes a fin extending from a semiconductor substrate, a gate stack over and along a sidewall of the fin, an isolation region surrounding the gate stack, an epitaxial source/drain region in the fin and adjacent the gate stack, and a source/drain contact extending through the isolation region, including a first silicide region in the epitaxial source/drain region, the first silicide region including NiSi$_2$, a second silicide region on the first silicide region, the second silicide region including TiSi$_x$, and a conductive material on the second silicide region.

20 Claims, 27 Drawing Sheets

(56) References Cited

U.S. PATENT DOCUMENTS

| | | | |
|---|---|---|---|
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,236,218 | B1 | 3/2019 | Xie et al. |
| 2005/0041918 | A1 | 2/2005 | Shibata et al. |
| 2009/0321839 | A1* | 12/2009 | Manabe .......... H01L 21/823835 257/E21.632 |
| 2014/0306291 | A1* | 10/2014 | Alptekin ............. H01L 27/1203 257/369 |
| 2019/0027473 | A1 | 1/2019 | Chen et al. |
| 2019/0157406 | A1* | 5/2019 | Hwang ............... H01L 27/0924 |
| 2019/0371671 | A1 | 12/2019 | Fenouillet-Beranger et al. |

* cited by examiner

CONTACT STRUCTURE FOR SEMICONDUCTOR DEVICE AND METHOD

PRIORITY CLAIM AND CROSS-REFERENCE

This application is a divisional of U.S. patent application Ser. No. 16/656,836, filed on Oct. 18, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
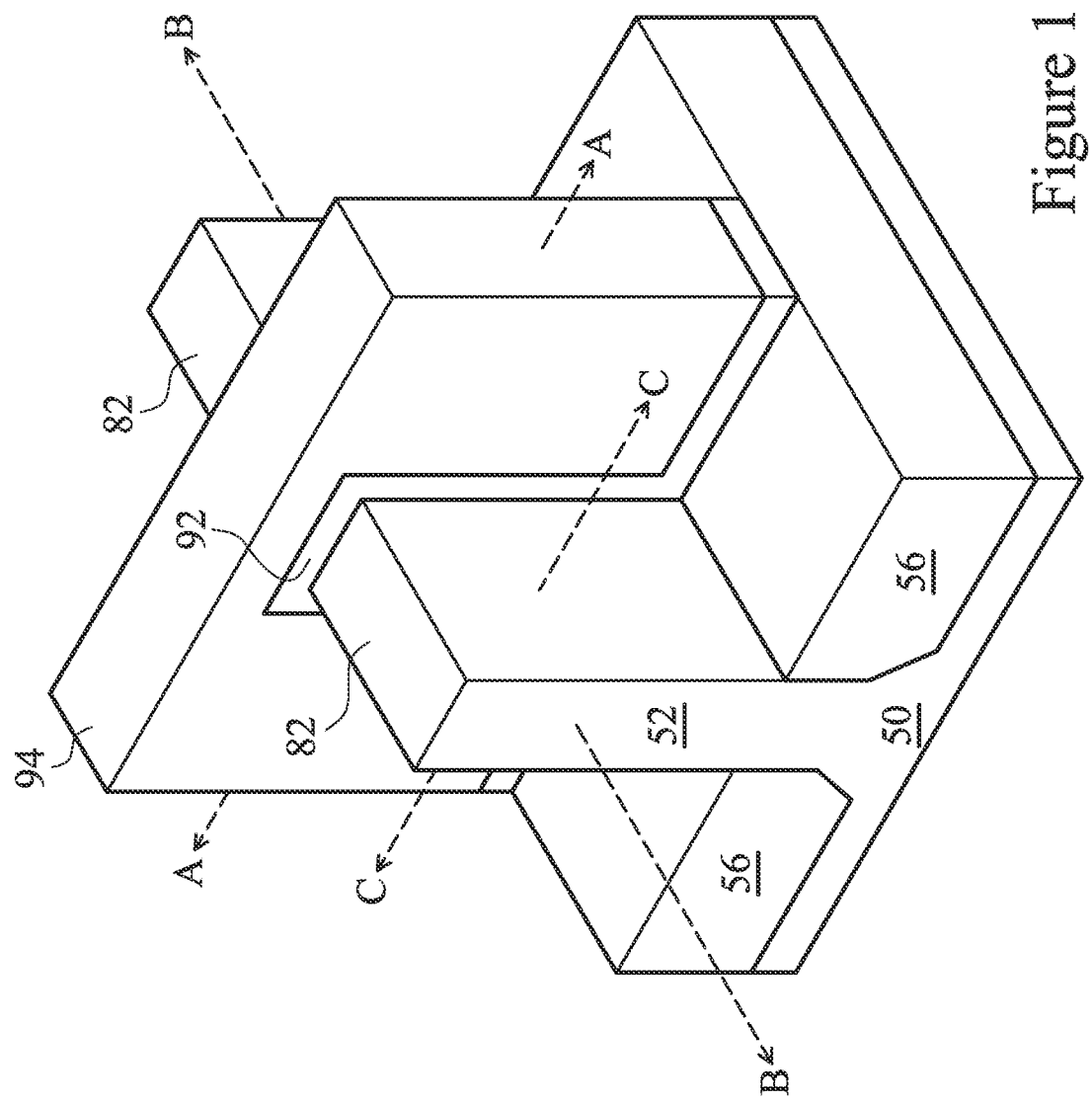
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the formation of a silicide region for a source/drain contact of a transistor (e.g., a FinFET or a planar FET). The techniques described herein describe the use of a pre-silicide layer to allow formation of a silicide region containing $NiSi_2$ at lower anneal temperatures. In some cases, the use of a lower temperature anneal to form silicide can reduce the chance of electrical shorts due to metal spiking or the chance of an undesirable threshold voltage shift ("Vt-shift"). The techniques described herein also describe the formation of a $NiSi_2$ silicide region with less implanted dopants, which can improve the resistance of the contact. Additionally, the $NiSi_2$ silicide regions can be formed having a faceted shape which provides larger surface area and reduces contact resistance. In some cases, silicide alloy regions may be formed over the $NiSi_2$ silicide regions, which can provide additional protection and thermal stability.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs. The embodiments described herein may be used in other devices in which a silicide is formed, such as in other types of transistors or in other types of devices such as diodes, and all such devices are contemplated in this disclosure.

FIGS. 2 through 25B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, and 25A are illustrated along reference cross-section A-A illustrated in FIG. 1, and FIGS. 8B, 9B, 10B, 11B, 12B, 13B, 14B, 14C, 15B, 16-24, and 25B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
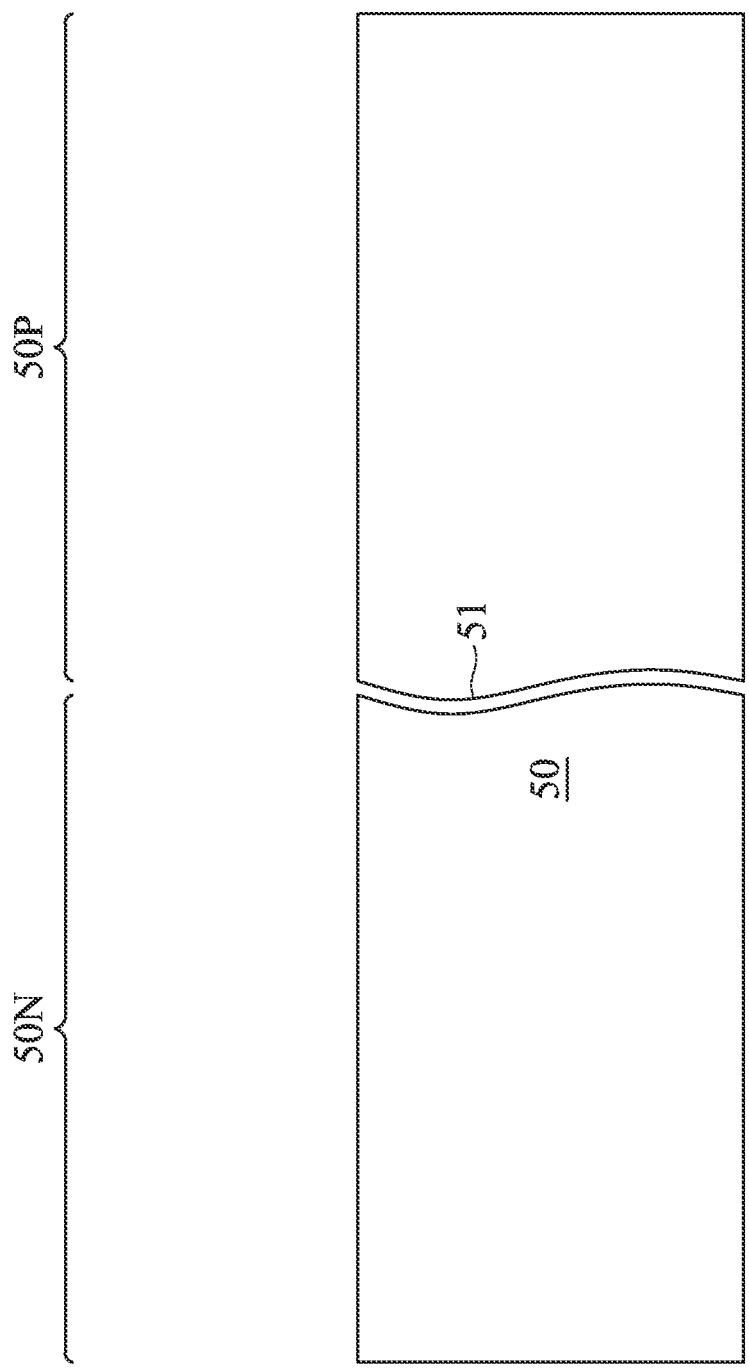
FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, and 15B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
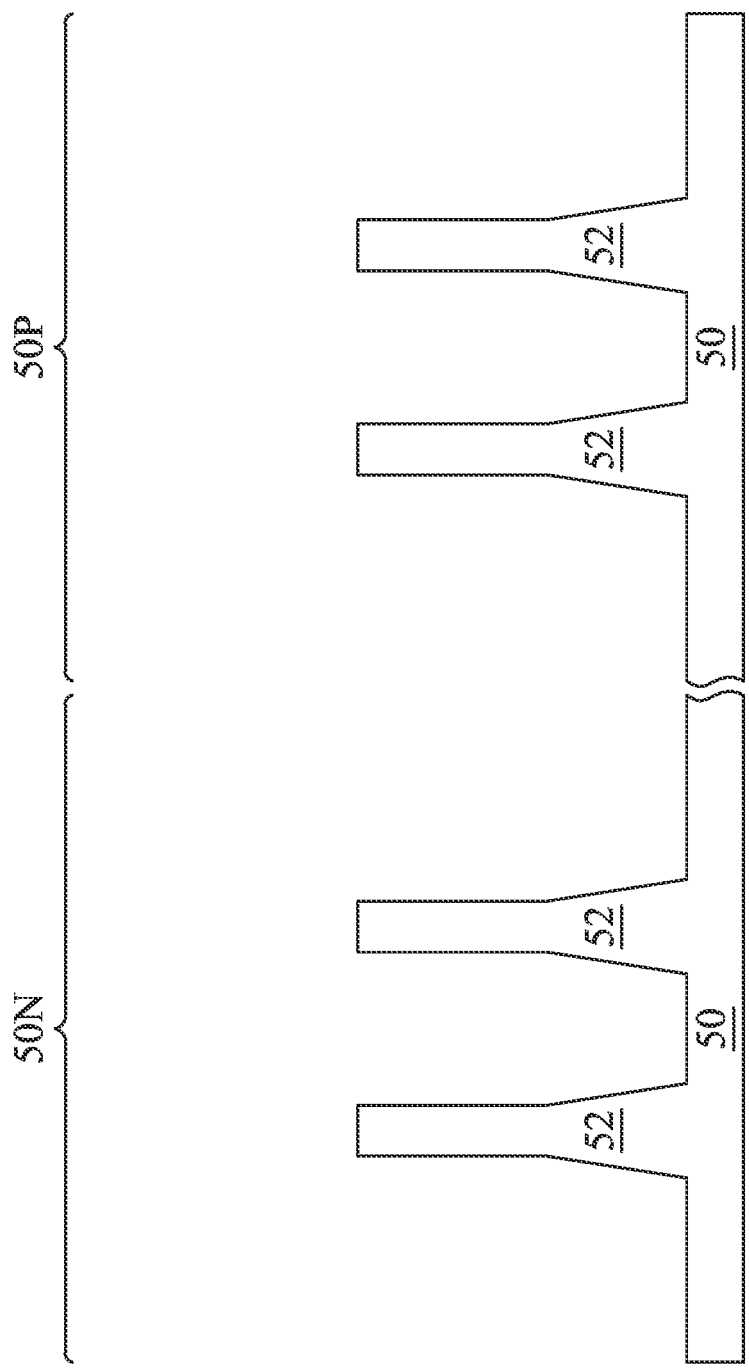

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
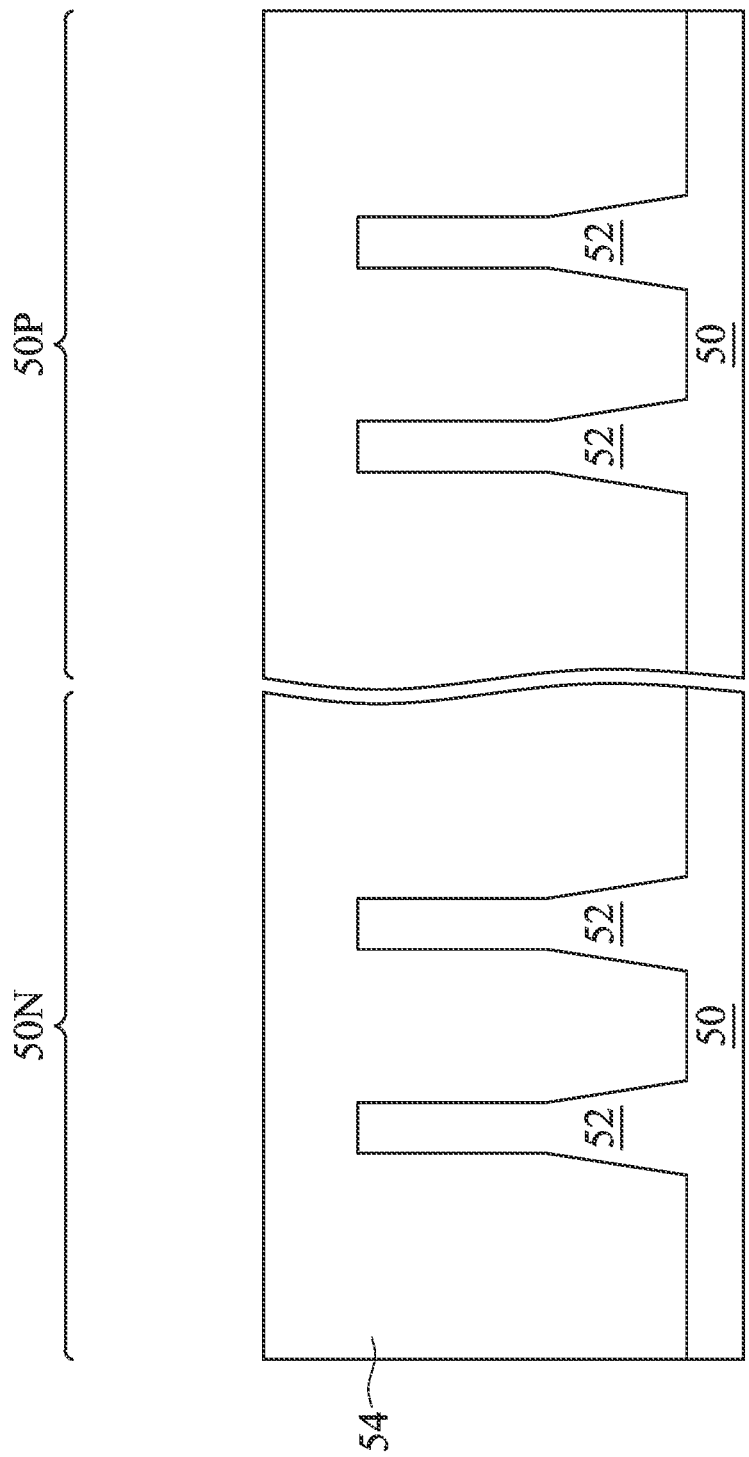

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
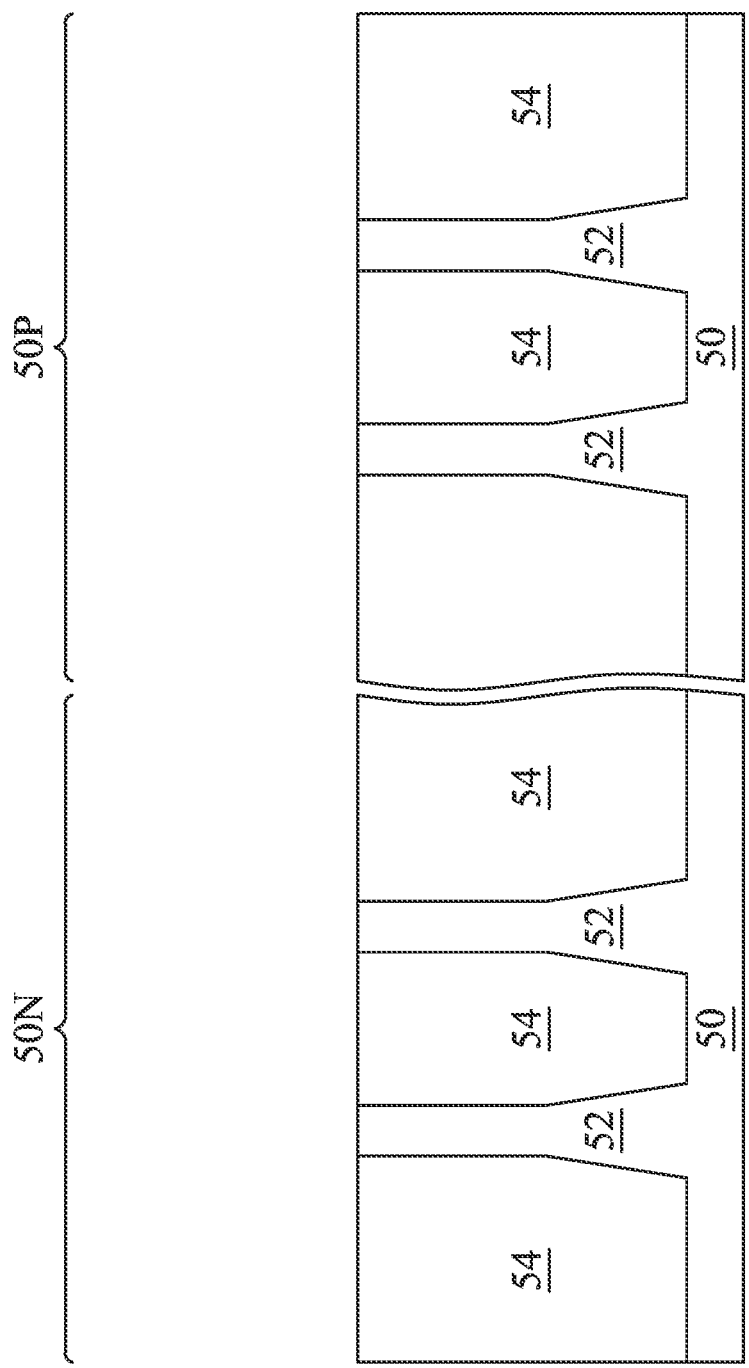

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
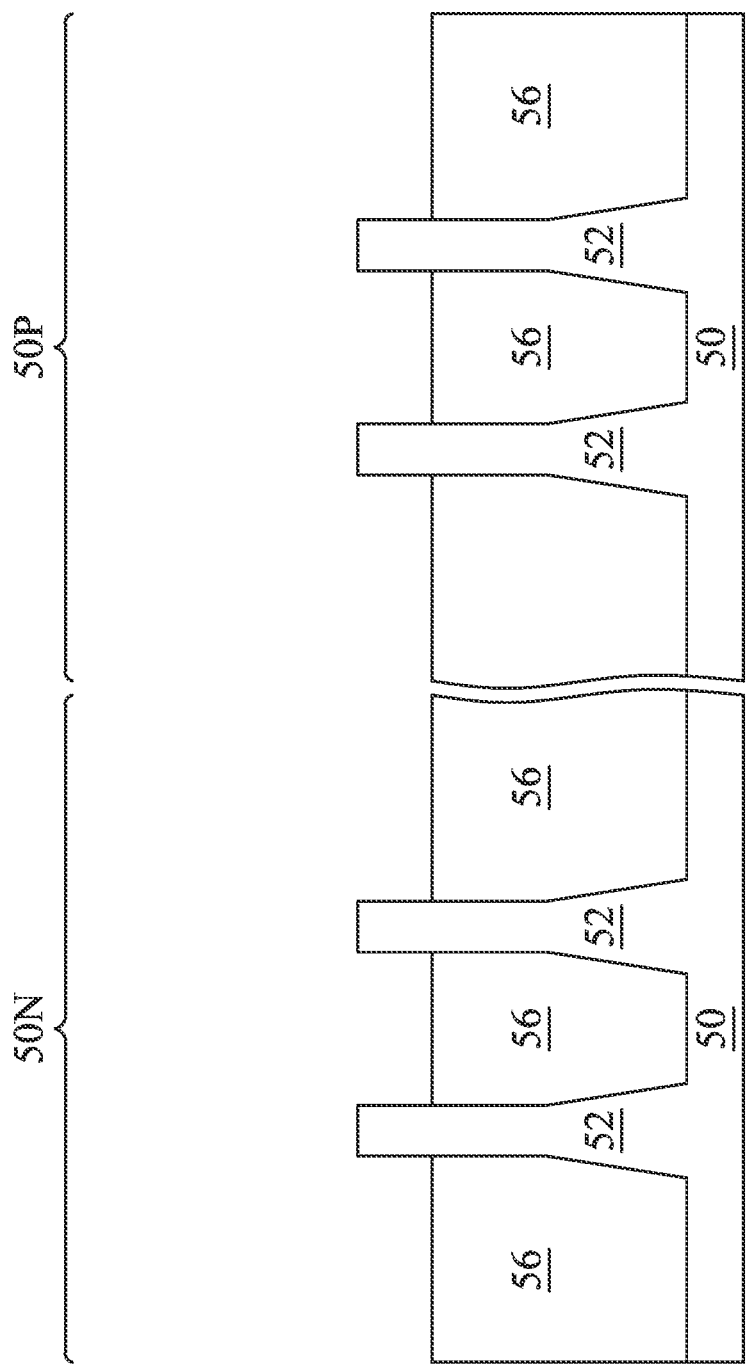

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
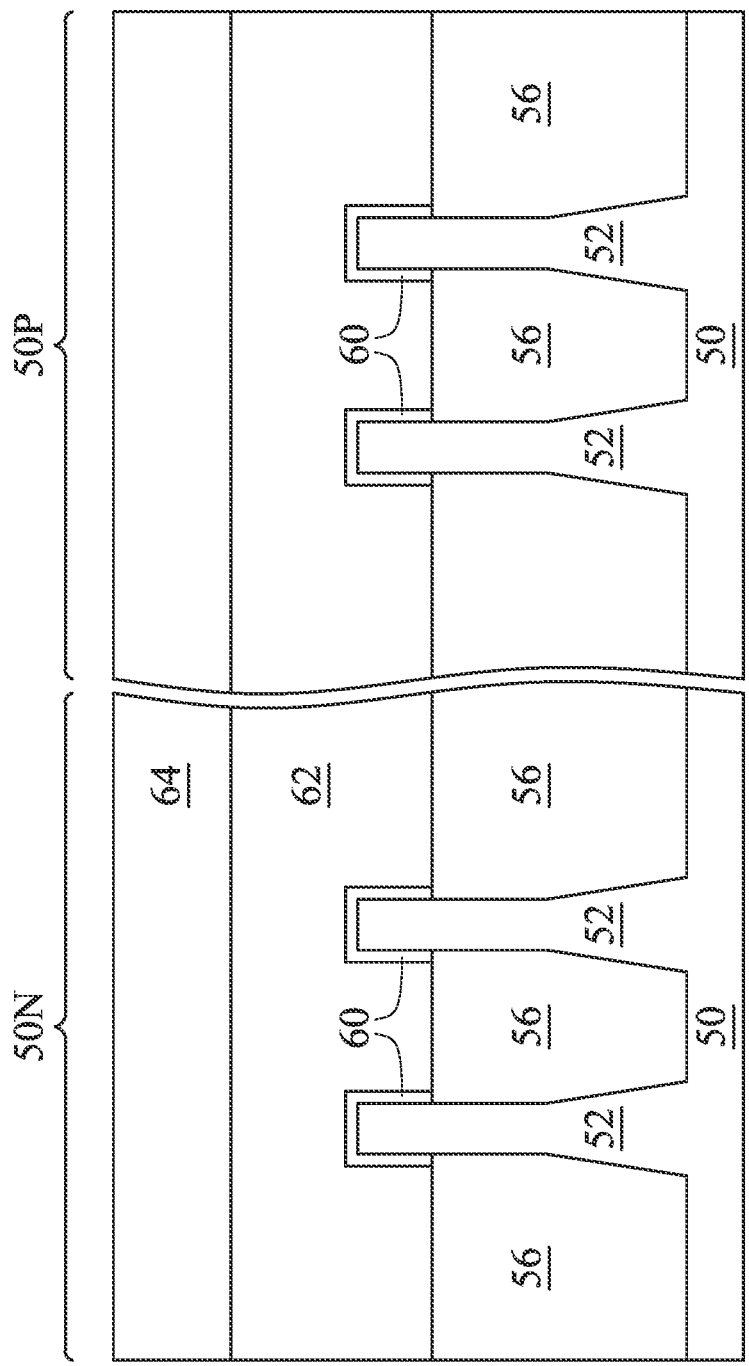

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
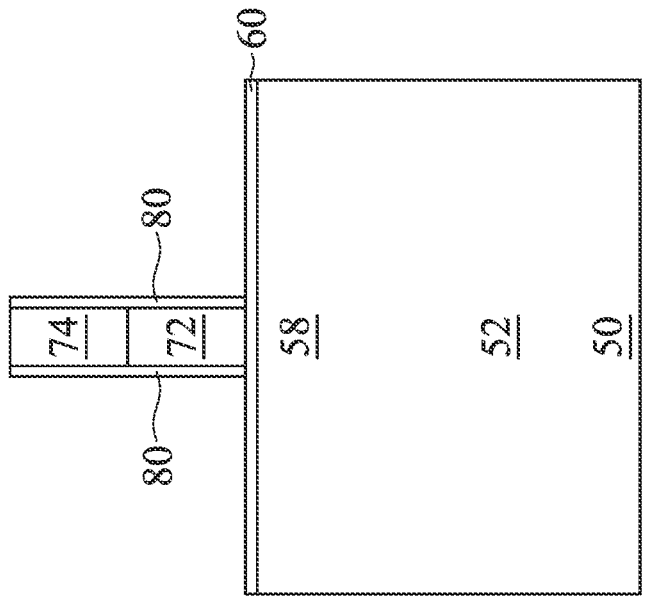
Figure 8A:
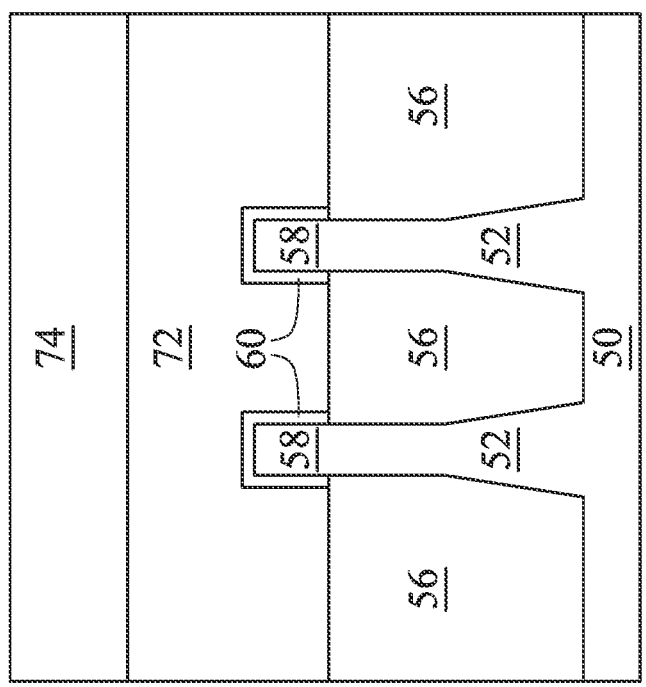

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
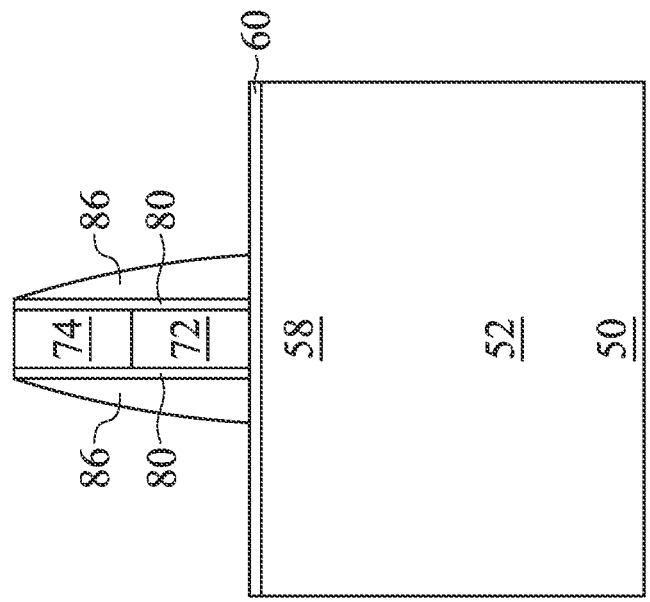
Figure 9A:
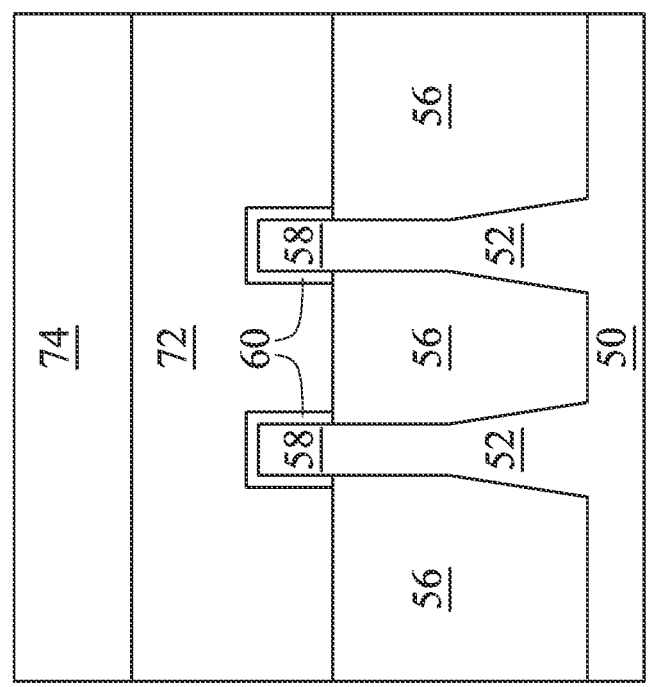

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
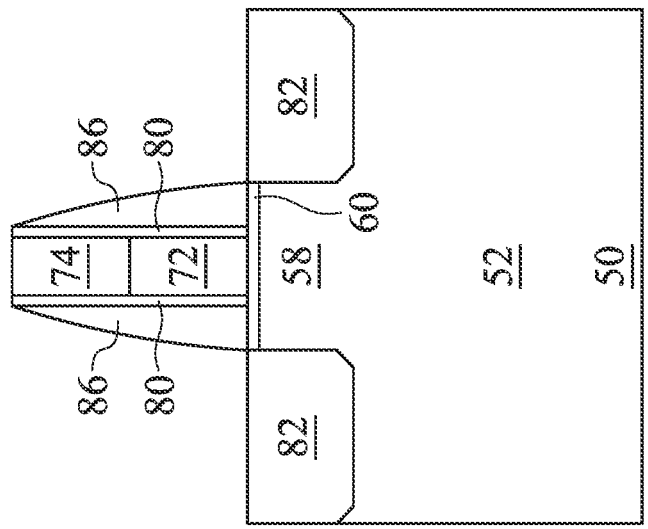
Figure 10A:
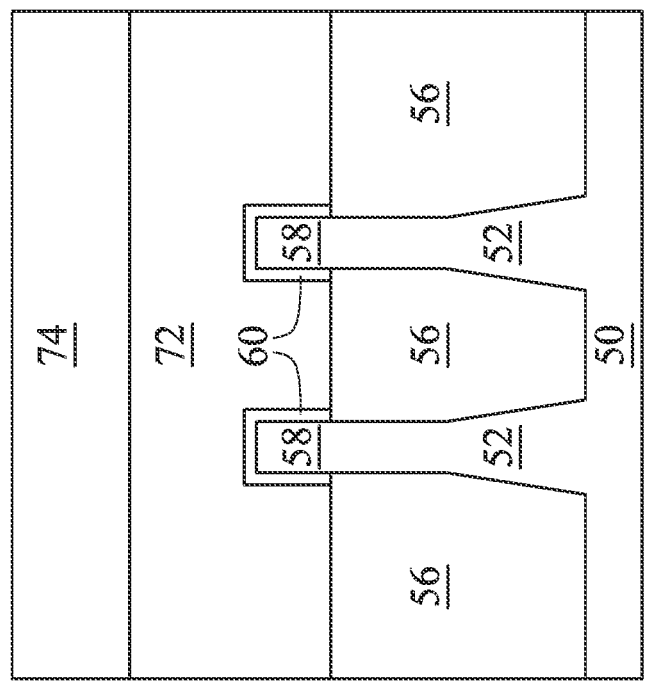
Figure 10C:
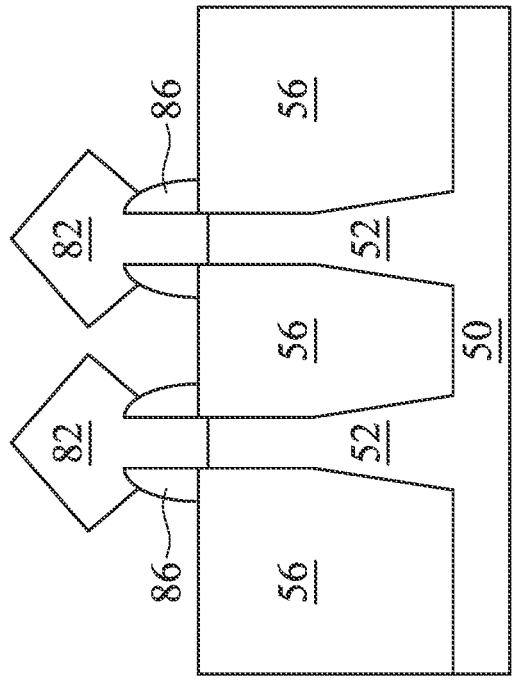
Figure 10D:
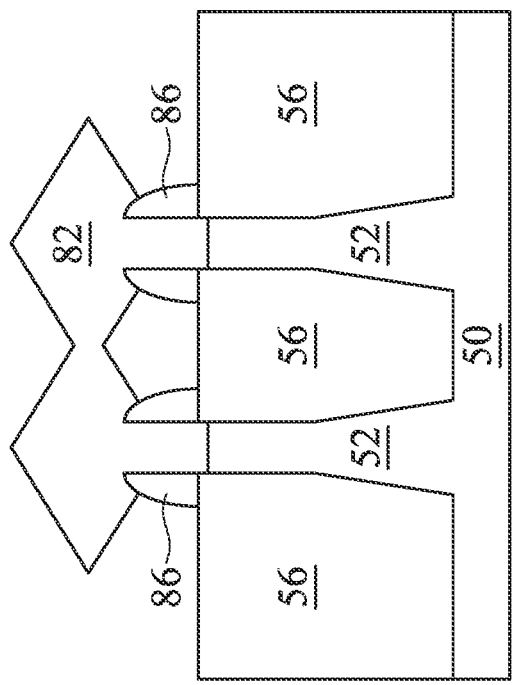

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
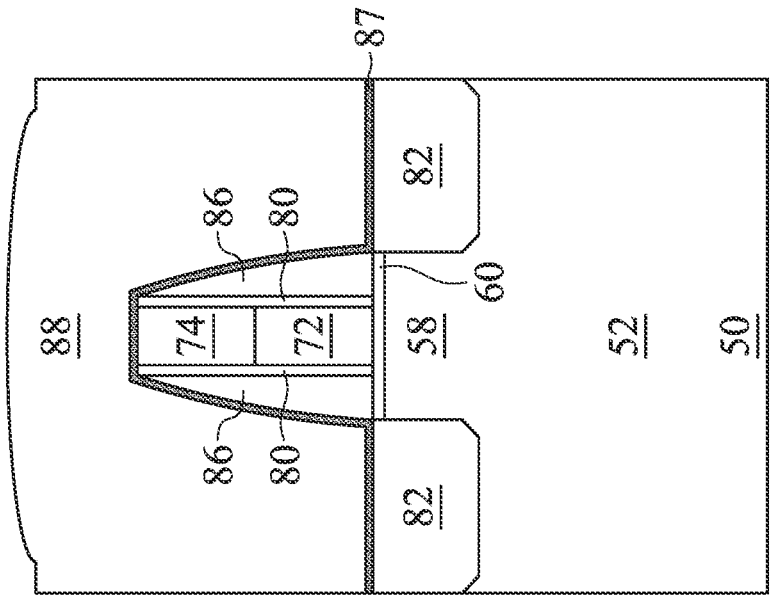
Figure 11A:
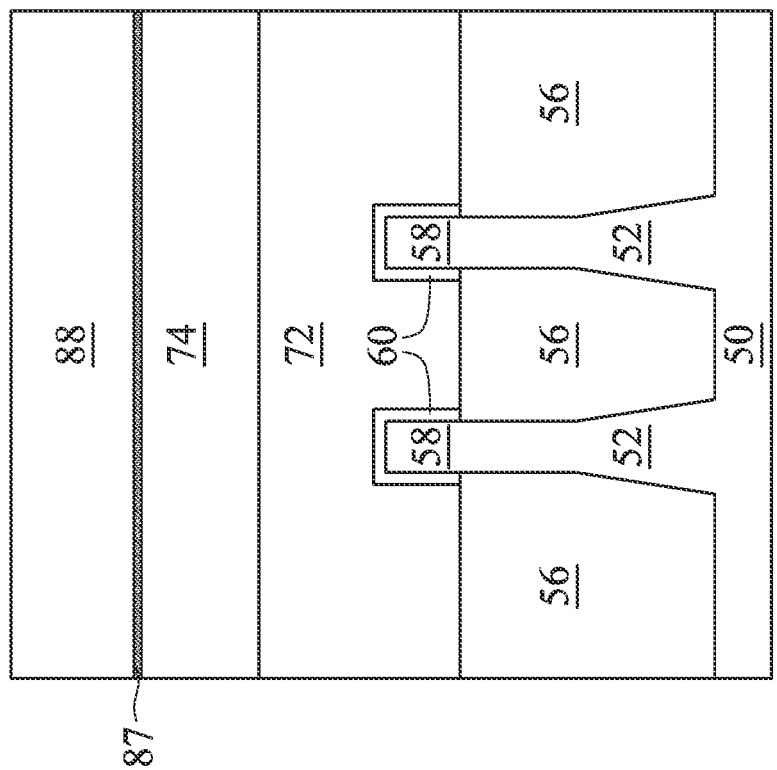

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
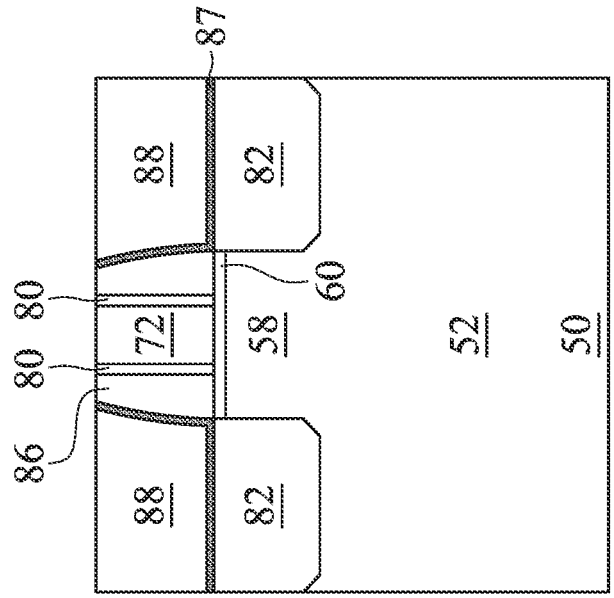
Figure 12A:
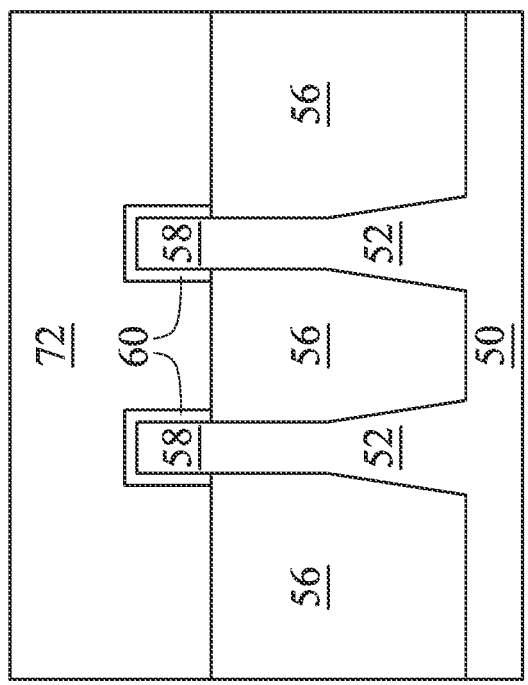

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
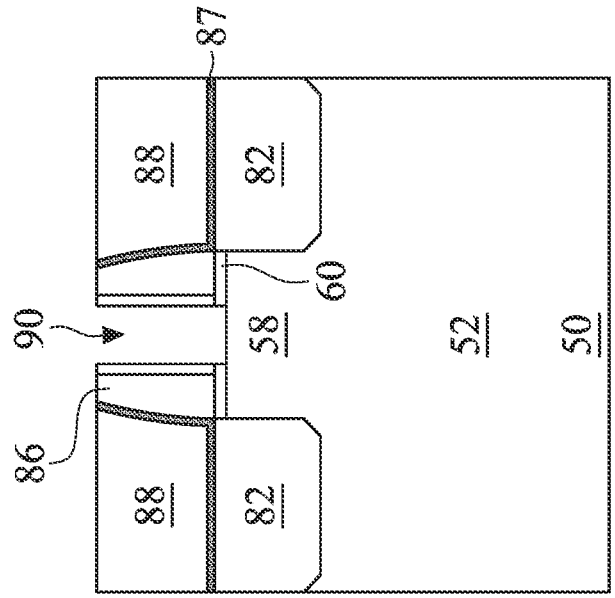
Figure 13A:
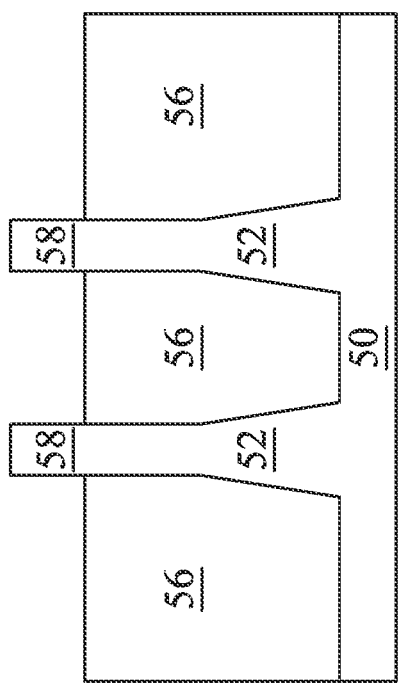

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
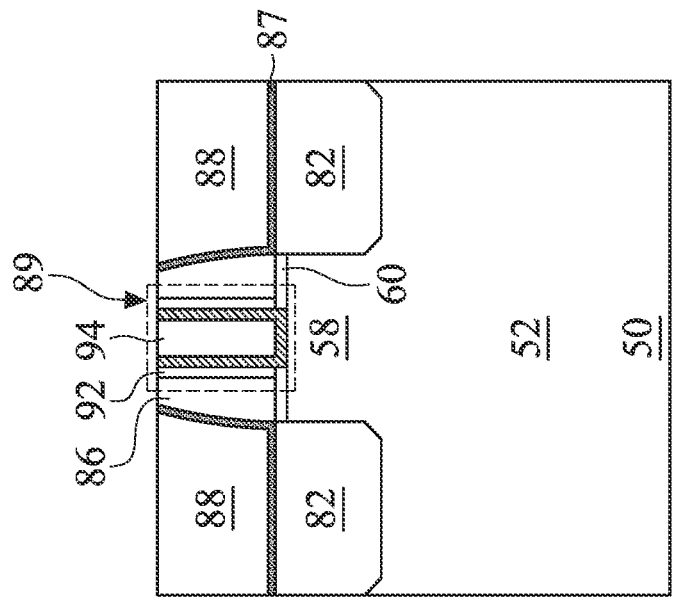
Figure 14A:
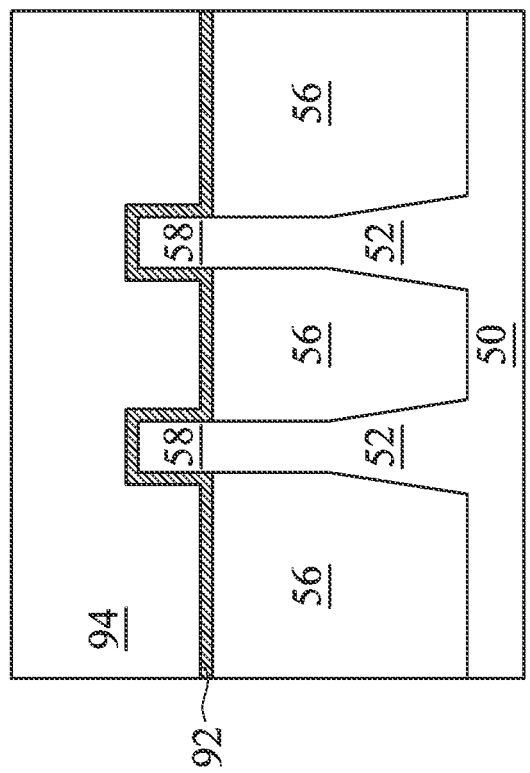
Figure 14C:
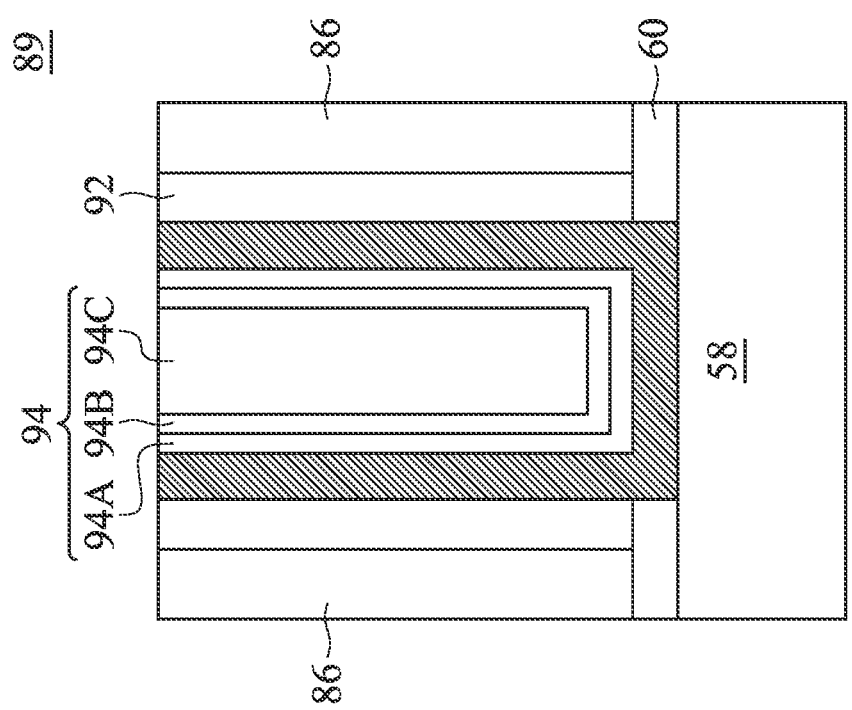

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
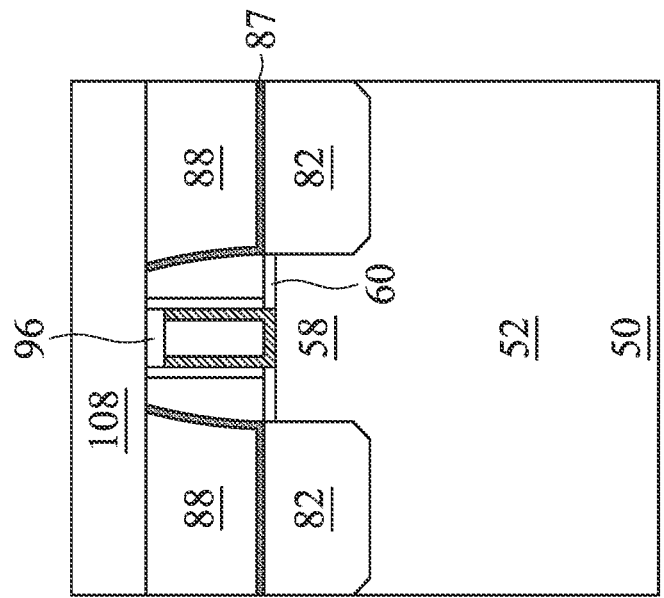
Figure 15A:
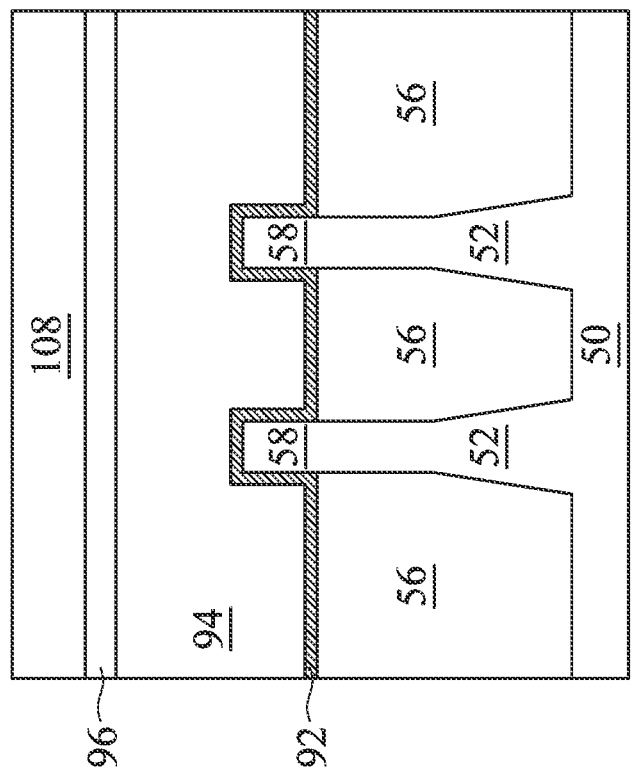

In FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 25A and 25B) penetrate through the gate mask 96 to contact the top surface of the recessed gate electrode 94.

Figure 16:
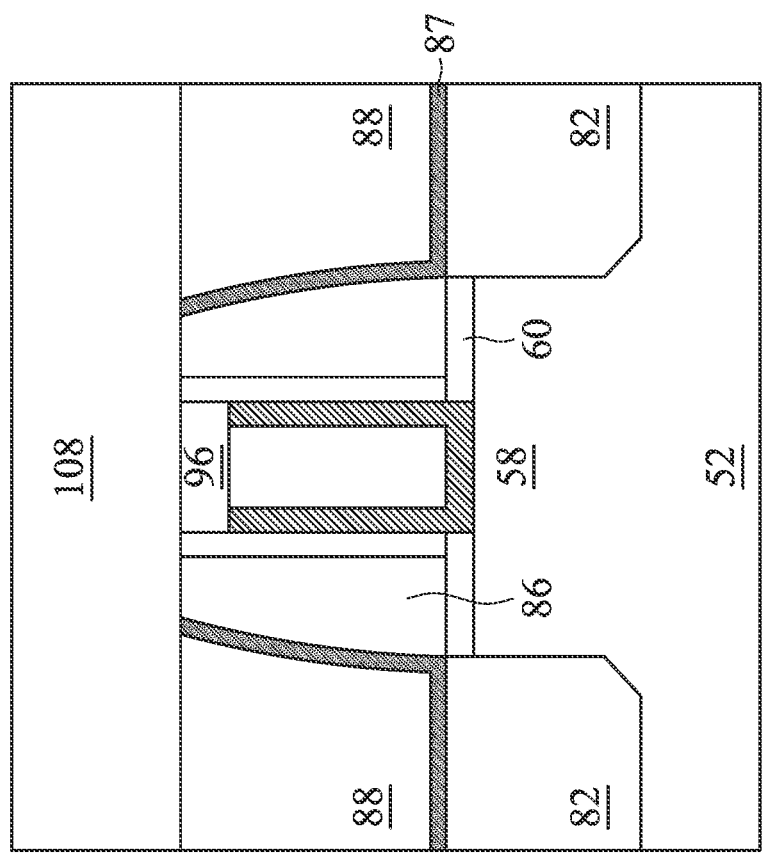
FIGS. 16, 17, 18, 19, 20, 21, 22, 23, 24, 25A, and 25B are cross-sectional views of intermediate stages in the manufacturing of epitaxial source/drain contacts of FinFETs, in accordance with some embodiments.

FIGS. 16 through 24 illustrate intermediate steps in the formation of source/drain contacts 112 (see FIG. 24), in accordance with some embodiments. The source/drain contacts 112 physically and electrically contact silicide regions 130 (see FIG. 24) formed on the epitaxial source/drain regions 82, and thus the source/drain contacts 136 are electrically coupled to the epitaxial source/drain regions 82. The source/drain contacts 112 may also be referred to as "contacts 112" or "contact plugs 112." For clarity, FIGS. 16 through 24 are shown as magnified views of a structure similar to that shown in FIG. 15B. For example, FIG. 16 shows a structure similar to that shown in FIG. 15B, e.g., after the second ILD 108 has been deposited over the first ILD 88.

Figure 17:
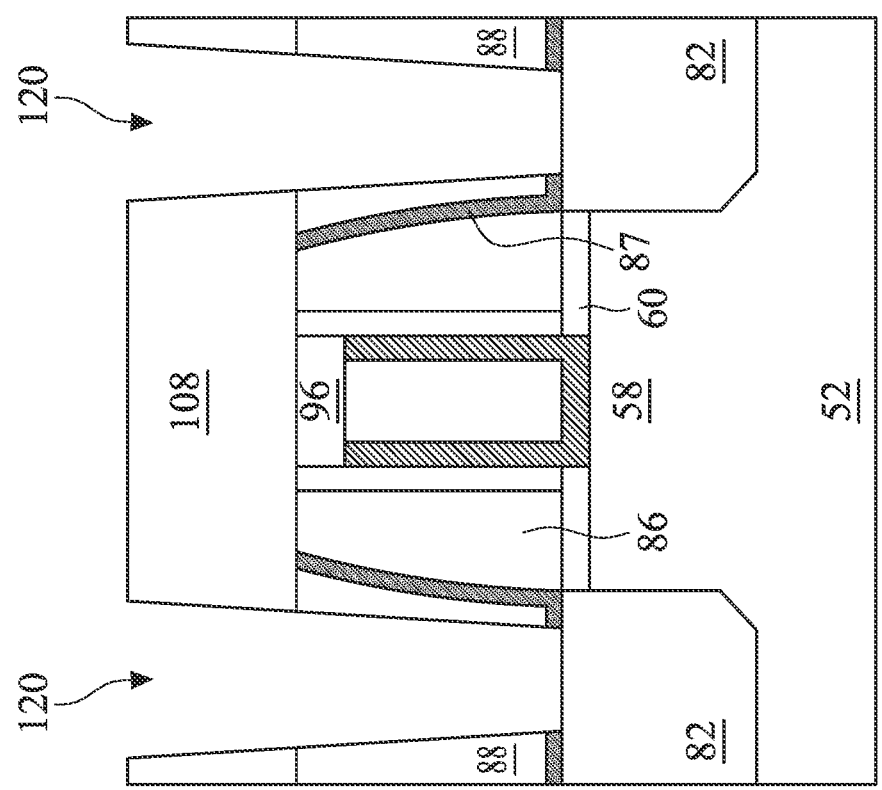

In FIG. 17, openings 120 are formed in the first ILD 88 and second ILD 88 to expose the epitaxial source/drain regions 82. The openings 120 may be formed using suitable photolithography and etching techniques. For example, a photoresist (e.g., a single layer or multi-layer photoresist structure) may be formed over the second ILD 108. The photoresist may then be patterned to expose the second ILD 108 in regions corresponding to the openings 120. One or more suitable etching processes may then be performed to etch the openings 120, using the patterned photoresist as an etching mask. The one or more etching processes may include wet etching processes and/or dry etching processes. In some embodiments, the CESL 87 may be used as an etch stop layer when forming the openings 120. The openings 120 may extend into the epitaxial source/drain regions 82.

In some embodiments, a pre-amorphization implant (PAI) may be performed on the exposed portions of the epitaxial source/drain regions 82. During the PAI, dopants are implanted into the epitaxial source/drain regions 82 to form amorphized regions (not shown). Forming amorphized regions of the epitaxial source/drain regions 82 in this manner can reduce dopant channeling or reduce the chance of forming silicide spikes ("spiking") that can cause failures due to electrical shorts. In some cases, the PAI may approximately determine the range of formation of a silicide (e.g., silicide 130 shown in FIG. 21). In some embodiments, the amorphized regions extend laterally and may extend under the first ILD 88 or under the gate spacers 86. The implanted dopants of the PAI may include silicon, germanium, xenon, or the like.

In some embodiments, a pre-clean step is performed on the exposed portions of the epitaxial source/drain regions 82. The pre-clean step may remove oxide (e.g., native oxide) present on the exposed portions of the epitaxial source/drain regions 82. The pre-clean step may be performed, for example, using a wet process (e.g., a wet chemical etching process) and/or a dry process (e.g., a plasma etching process).

Figure 18:
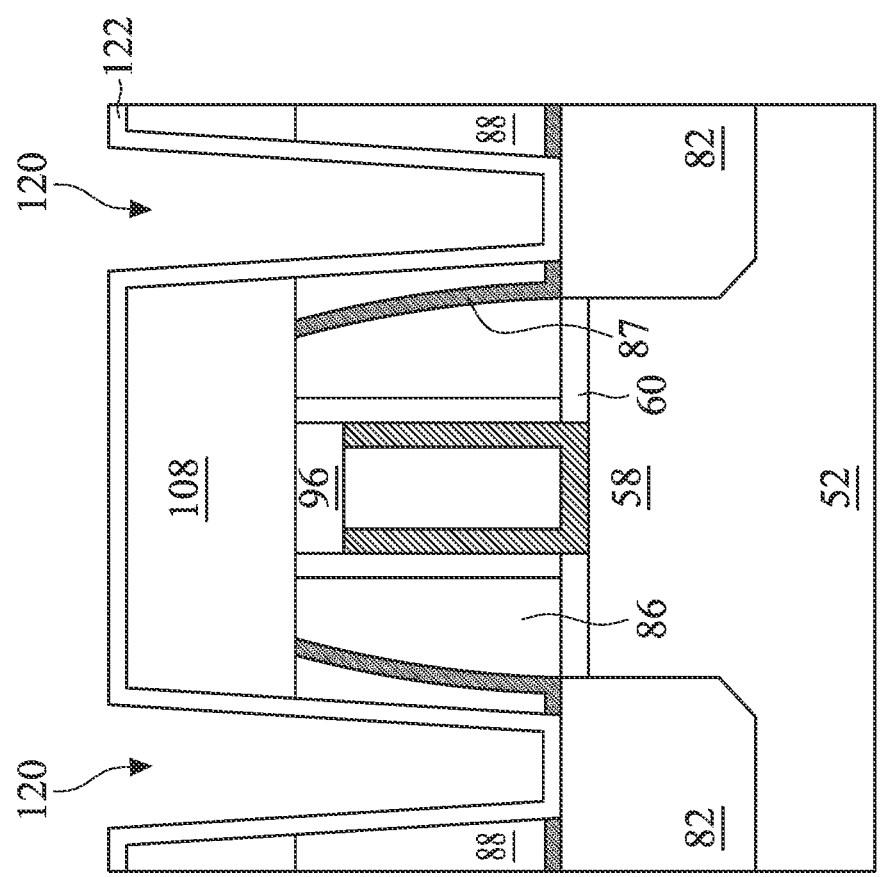

Turning to FIG. 18, a pre-silicide layer 122 is formed within the openings 120 and over the exposed portions of the epitaxial source/drain regions 82, in accordance with some embodiments. As shown in FIG. 18, the pre-silicide layer 122 may be formed as a blanket layer. The pre-silicide layer 122 is formed to retard the diffusion of the material of the subsequently formed silicide material layer 124 (see FIG. 19) during subsequent anneal processes. In some cases, the use of a pre-silicide layer 122 as described can allow for the formation of $NiSi_2$ in silicide regions 130 using lower anneal temperatures and without the use of an implanted pre-dopant, described in greater detail below. In some embodiments, the pre-silicide layer 122 is formed of one or more materials such as titanium (Ti) or titanium silicide ($TiSi_x$), though other materials may be used in other embodiments. The pre-silicide layer 122 may be formed using a suitable deposition technique, such as CVD, PVD, ALD, or the like. In some cases, Ti may be deposited as the pre-silicide layer 122 on a silicon-containing surface (e.g., on the epitaxial source/drain regions 82), and a $TiSi_x$ material forms at the interface between the silicon-containing surface and the pre-silicide layer 122. In some cases, a different deposition technique or deposition temperature can form different proportions of Ti and $TiSi_x$. For example, in some cases, depositing Ti using a PVD technique can result in a lower proportion of $TiSi_x$ being formed than depositing Ti using a CVD technique. In some cases, depositing Ti at a lower temperature can result in a lower proportion of $TiSi_x$ being formed than depositing Ti at a higher temperature. In some embodiments, the pre-silicide layer 122 may be formed having a thickness between about 1 nm and about 5 nm, though other thicknesses are possible.

Figure 19:
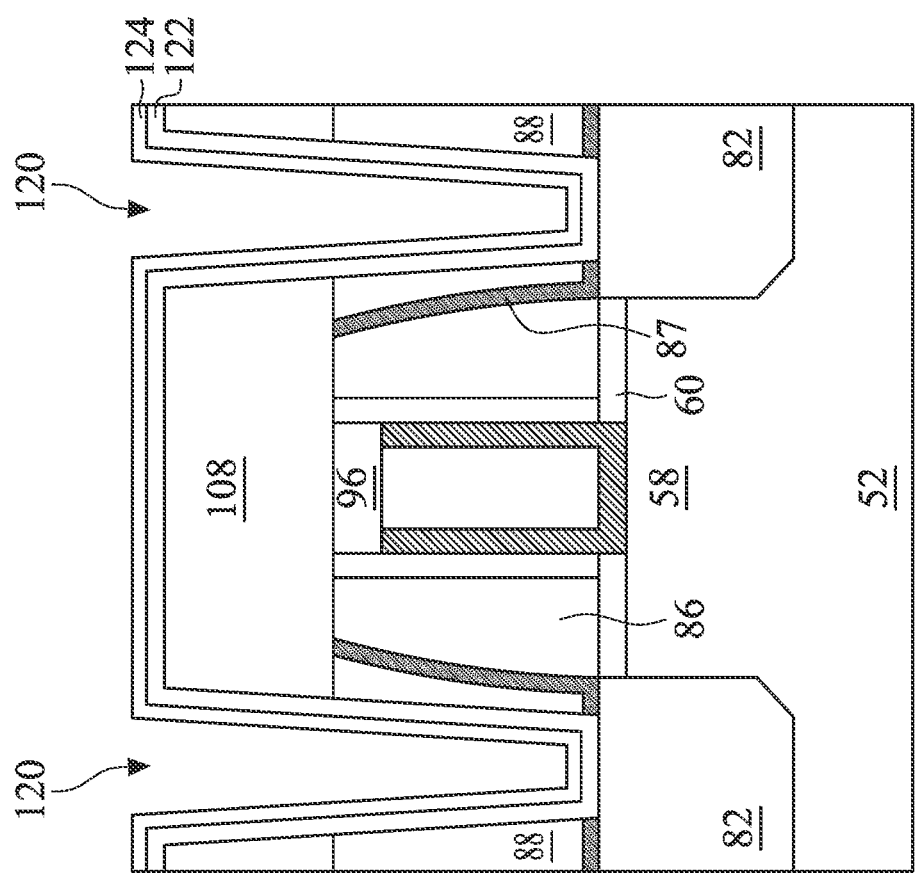

FIG. 19 illustrates the formation of a silicide material layer 124 over the pre-silicide layer 122, in accordance with some embodiments. As shown in FIG. 19, the silicide material layer 124 may be formed as a blanket layer. The silicide material layer 124 includes the material (e.g., one or more metals) that subsequently forms the silicide region 130 (see FIG. 21). For example, the material of the silicide material layer 124 may diffuse through the pre-silicide layer 122 and act as a reacting source for formation of the silicide region 130. In some embodiments, the silicide material layer 124 may include nickel (Ni), titanium (Ti), cobalt (Co), platinum (Pt), NiPt, the like, or combinations thereof. The silicide material layer 124 may be formed using a suitable deposition technique, such as CVD, PVD, ALD, or the like. In some embodiments, the silicide material layer 124 may be formed having a thickness between about 30 Å and about 200 Å, though other thicknesses are possible.

Figure 20:
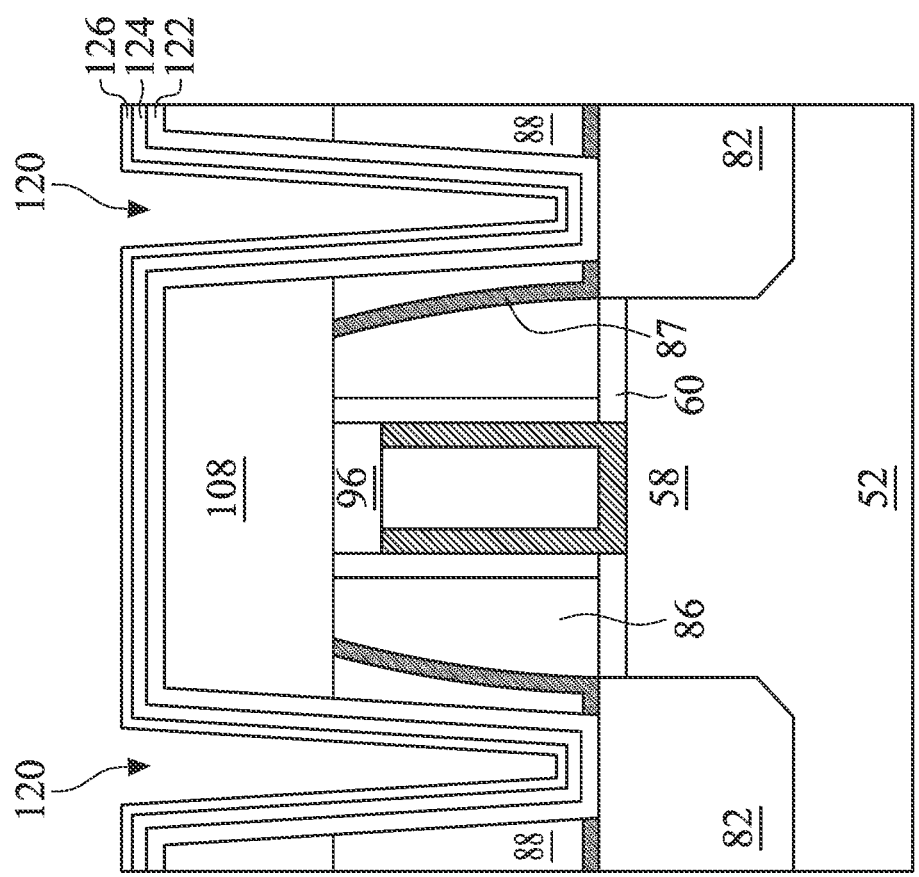

FIG. 20 illustrates the formation of a capping layer 126 over the silicide material layer 124, in accordance with some embodiments. As shown in FIG. 20, the capping layer 126 may be formed as a blanket layer. The capping layer 126 may be formed to protect the silicide material layer 124 and reduce the formation of oxide (e.g., silicon oxide). In some embodiments, the capping layer 126 may include titanium (Ti), titanium nitride (TiN), the like, or combinations thereof. The capping layer 126 may be formed using a suitable deposition technique, such as CVD, PVD, ALD, or the like. In some embodiments, the capping layer 126 may be formed having a thickness between about 15 Å and about 100 Å, though other thicknesses are possible. In some cases, pre-silicide layer 122, the silicide material layer 124, and the capping layer 126 may be formed in the same process chamber, which can reduce the formation of oxide and thus improve contact resistance of the subsequently formed contact 112.

Figure 21:
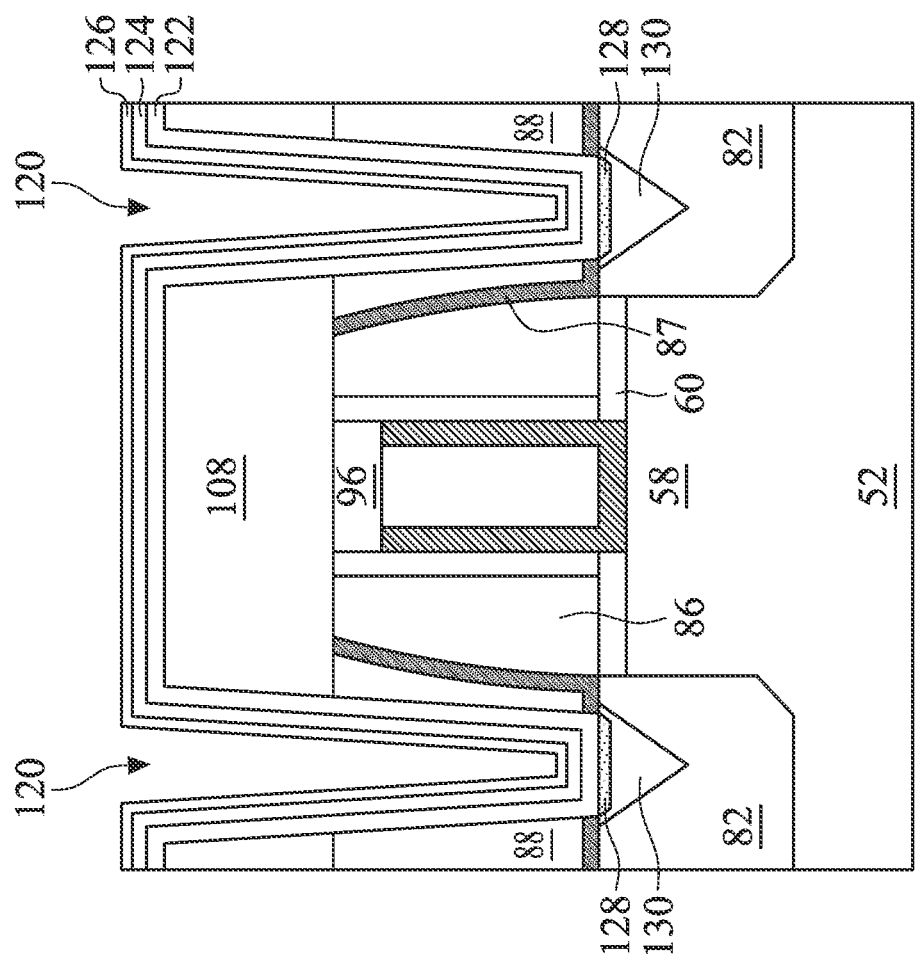

In FIG. 21, a low-temperature anneal ("LT anneal") is performed to form silicide regions 130, in accordance with some embodiments. During the LT anneal, material from the silicide material layer 124 diffuses through the pre-silicide layer 122 and into the epitaxial source/drain regions 82. The material from the silicide material layer 124 reacts with the silicon of the epitaxial source/drain regions 82 to form silicide regions 130. In some embodiments, the silicide regions 130 may be formed extending a depth D into the epitaxial source/drain regions 82 that is between about 40 Å and about 200 Å, though the silicide regions 130 may have other dimensions in other cases. Additionally, material of the pre-silicide layer 122 may react with the silicon of the epitaxial source/drain regions 82 to form silicide alloy regions 128 over the silicide regions 130. The presence of the silicide alloy regions 128 over the silicide regions 130 may provide additional thermal stability to the silicide regions 130, such as reducing the chance of the silicide regions 130 forming metal spikes during subsequent anneals. In some embodiments, the silicide alloy regions 128 may be formed having a thickness between about 15 Å and about 50 Å, though other thicknesses are possible. In some cases, a silicide region 130 may laterally surround the associated silicide alloy region 128. In some cases, the silicide regions 130 may laterally extend under the first ILD 88.

As an illustrative example, for an embodiment in which the pre-silicide layer 122 comprises Ti and the silicide material layer 124 comprises Ni, during the LT anneal, some of the Ni may diffuse through the pre-silicide layer 122 into the epitaxial source/drain regions 82 to form a silicide such as NiSi and/or $NiSi_2$. Still referring to the example, some of the Ti of the pre-silicide layer 122 may react to form a silicide alloy region 128 comprising $TiSi_x$. In some embodiments, regions at the interface between the silicide region 130 and silicide alloy region 128 may comprise a combination of NiSi, $NiSi_2$, and/or $TiSi_x$. This is an illustrative example, and other materials or reaction products are possible and considered within the scope of this disclosure. In some cases, silicide alloy regions 128 may not be formed during the LT anneal.

In some embodiments, the LT anneal may include, for example, a rapid thermal anneal (RTA) and/or a laser anneal. In some embodiments, the LT anneal may include an RTA at a temperature between about 300° C. and about 450° C. for a duration of time between about 1 seconds and about 900 seconds. In some embodiments, the LT anneal may include a laser anneal at a temperature between about 600° C. and about 800° C. for a duration of time between about 0.1 microseconds and about 1 microsecond. In some embodiments, both an RTA and a laser anneal may be performed as part of the LT anneal. In some embodiments, the LT anneal may include an additional anneal after a cleaning process is performed, described in greater detail below.

In some cases, the use of a pre-silicide layer 122 as described herein can allow for the use of lower anneal temperatures to form silicide regions 130 comprising $NiSi_2$. In some cases, the presence of a Ti pre-silicide layer 122 can retard the diffusion of Ni of the silicide material layer 124 into the epitaxial source/drain regions 82, which may allow the Ni to react more slowly with the Si of the epitaxial source/drain region and form $NiSi_2$. Thus, the presence of the pre-silicide layer 122 promotes the formation of $NiSi_2$ in the silicide regions 130 during the LT anneal. This can allow silicide regions 130 that contain $NiSi_2$ to be formed at lower anneal temperatures than without the presence of the pre-silicide layer 122. In this manner, problems associated with forming $NiSi_2$ using a higher temperature anneal (e.g., RTA greater than 600° C. or laser anneal greater than 900° C.) can be reduced. Problems associated with a higher temperature anneal include the formation of metal spikes from the silicide regions, agglomeration within the silicide regions, or shifting of the threshold voltage of the transistor ("Vt-shift"). Additionally, silicide regions 130 containing $NiSi_2$ can be formed without the use of a pre-dopant implant (e.g., implanting C, O, N, Ar, etc.). Because the silicide regions 130 are free of these dopants, problems associated with the use of a pre-dopant implant can be reduced, such as increased contact resistance due to the presence of the dopants.

In some embodiments, the temperature and/or time of the LT anneal may be controlled to form silicide regions 130 having a larger proportion of $NiSi_2$ than NiSi. For example, the silicide regions 130 may be formed comprising between about 70% and about 100% $NiSi_2$. In some cases, the formation of silicide regions 130 comprising $NiSi_2$ may have advantages. For example, the Schottky Barrier Height (SBH) between a $NiSi_2$ silicide and the epitaxial source/drain regions 82 of a p-type transistor (e.g., a "PFET") is lower than the SBH of a NiSi silicide, and thus the presence of $NiSi_2$ can reduce contact resistance in a PFET transistor. In some cases, $NiSi_2$ has more thermal stability than NiSi. For example, $NiSi_2$ is less susceptible than NiSi to forming Ni spikes during any subsequent anneals performed during processing. Additionally, the $NiSi_2$ within the silicide regions 130 can form facets, as shown by the "triangular" shape of the silicide regions 130 illustrated in FIG. 21. In some cases, forming silicide regions 130 having a faceted or "triangular" shape can increase the surface area of the silicide regions 130. By increasing the surface area of the silicide regions 130 in this manner, the contact resistance of the contacts 112 may be reduced. In some cases, the facets of the $NiSi_2$ of the silicide regions 130 may correspond to a crystalline orientation of (111), (110), or (100) on silicon having an orientation of (001).

Figure 22:
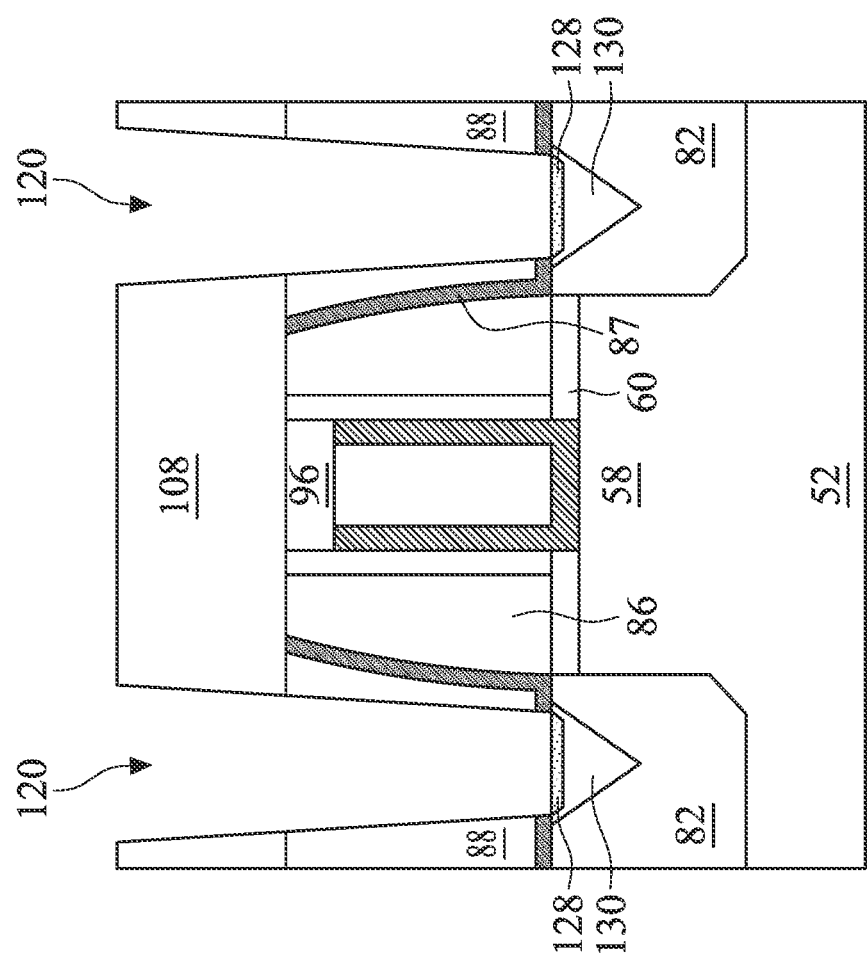

Turning to FIG. 22, un-reacted portions of the pre-silicide layer 122, the silicide material layer 124, and the capping layer 126 are removed, in accordance with some embodiments. The un-reacted portions may be removed using an etching process, such as a selective etching process that is selective to the un-reacted material. For example, the unreacted portions may be removed using a wet chemical etch of $H_2SO_4$ and $H_2O_2$ used at a temperature range between about 150° C. and about 200° C. for a time duration between about 30 seconds and about 60 seconds. Other wet chemical etches may be used, such as a wet chemical etch of HCl and $H_2O_2$, a wet chemical etch of $NH_3OH$ and $H_2O$, or another wet chemical etch, which may be used for a duration between about 30 seconds and about 180 seconds in some embodiments.

In some embodiments, an additional LT anneal may be performed after the un-reacted portions of the pre-silicide layer 122, the silicide material layer 124, and the capping layer 126 have been removed. In some cases, the additional LT anneal may promote formation of $NiSi_2$ within the silicide regions 130. In some embodiments, a first LT anneal may be performed after the capping layer 126 has been formed, and a second LT anneal may be performed after removing the un-reacted portions. The first LT anneal or the second LT anneal may be similar to the LT anneal described above in FIG. 21. For example, the first LT anneal may include an RTA at a temperature between about 250° C. and about 300° C. for a duration of time between about 1 seconds and about 900 seconds. The second LT anneal may include an RTA at a temperature between about 300° C. and about 450° C. for a duration of time between about 1 seconds and about 900 seconds. In some embodiments, the second LT anneal may include a laser anneal at a temperature between about 600° C. and about 800° C. for a duration of time between about 0.1 microseconds and about 1 microsecond. The first LT anneal or the second LT anneal may have other temperatures or time durations in other embodiments.

Figure 23:
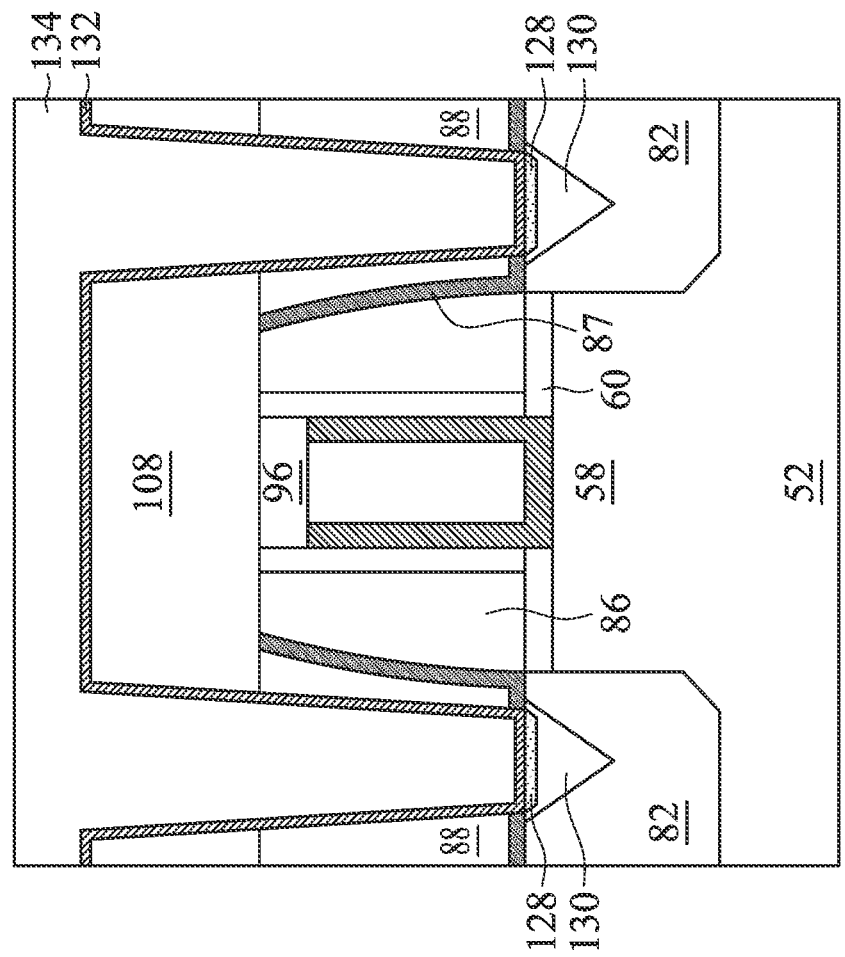

Turning to FIG. 23, a liner 132 and conductive material 134 are formed within the openings 120, in accordance with some embodiments. The liner 132 is deposited over the silicide alloy regions 128 and/or the silicide regions 130 within the opening 120. The liner 132 may include a diffusion barrier layer, an adhesion layer, the like, or a combination thereof. The liner 132 may include, for example, one or more layers of titanium, titanium nitride, tantalum, tantalum nitride, or the like. The conductive material 134 is formed over the liner 132. The conductive material 134 may include one or more materials such as copper, a copper alloy, silver, gold, tungsten, cobalt, aluminum, nickel, or the like. The liner 132 or the conductive material 134 may be deposited using one or more suitable processes, such as CVD, PVD, ALD, sputtering, plating, or the like.

Figure 24:
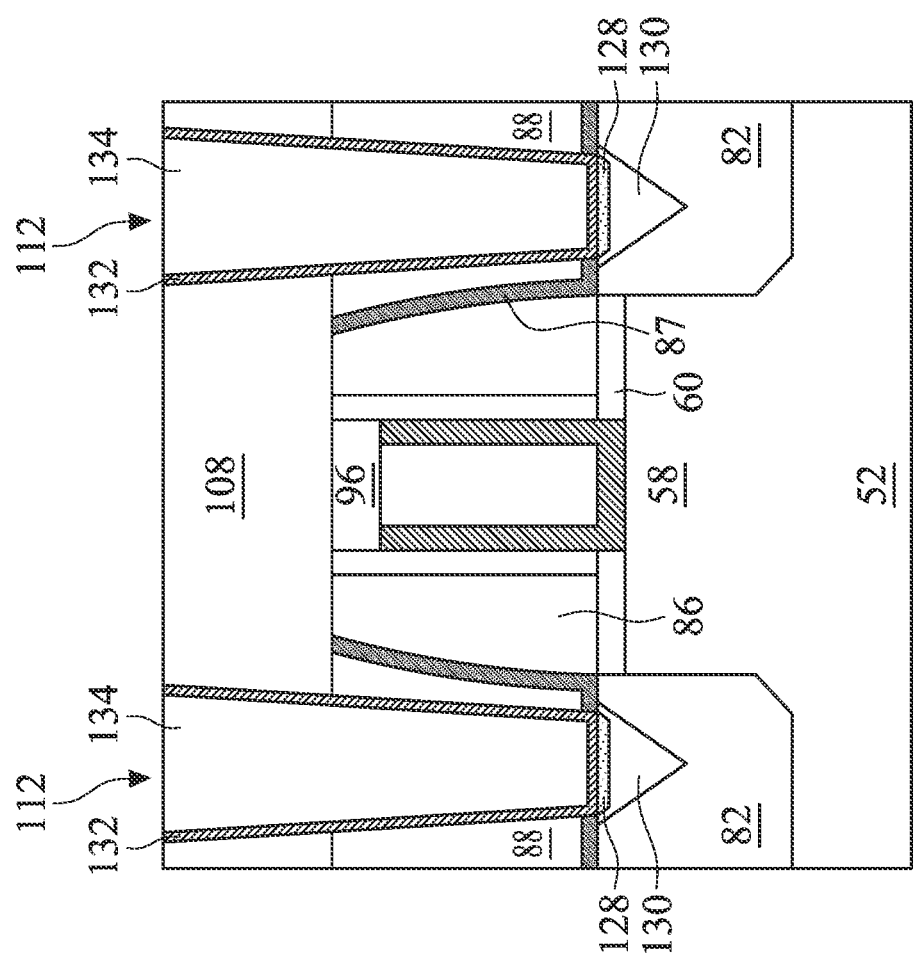

Turning to FIG. 24, a planarization process, such as a CMP process or grinding process, may be performed, in accordance with some embodiments. The planarization process may be performed to remove excess liner 132 material and conductive material 134 from the top surface of the second ILD 108. The remaining liner 132 and conductive material 134 form contacts 112 to the epitaxial source/drain regions 82. The conductive material 134 of the contacts 112 makes electrical connection to the epitaxial source/drain regions 82 through the silicide regions 130.

Figure 25B:
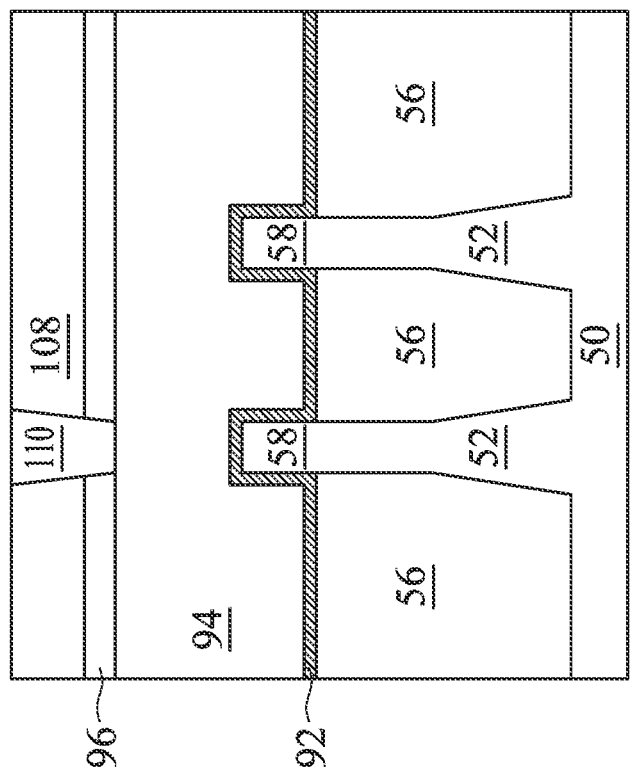
Figure 25A:
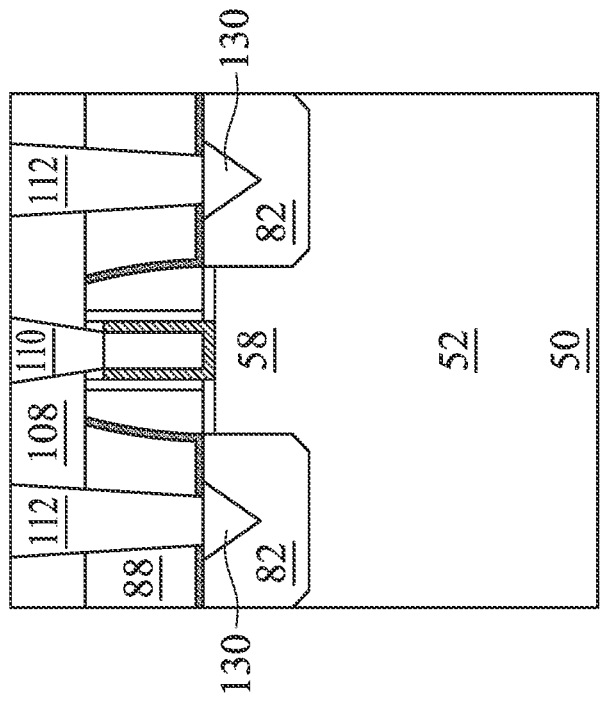

FIGS. 25A-25B show the formation of gate contacts 110, in accordance with some embodiments. The gate contacts 110 are physically and electrically coupled to the gate electrodes 106. In some embodiments, the gate contacts 110 may be formed, for example, by forming openings for the gate contacts 110 through the second ILD 108 and the gate mask 96, and then depositing a liner and conductive material within the openings. The openings may be formed using acceptable photolithography and etching techniques. The gate contacts 110 may include a liner and conductive material similar to the liner 132 or conductive material 134 described above for the contacts 112. The source/drain contacts 112 and gate contacts 110 may be formed using different process steps, or may be formed using some of the same process steps. Although shown as being formed in the same cross-sections in FIG. 25B, it should be appreciated that each of the source/drain contacts 112 and gate contacts 110 may be formed in different cross-sections, which may avoid shorting of the contacts.

The embodiments of the present disclosure have some advantageous features. By depositing a pre-silicide layer (e.g., a Ti layer) prior to depositing a silicide material (e.g., Ni or NiPt), a silicide comprising $NiSi_2$ may be formed using lower anneal temperatures. A lower-temperature anneal is less likely to cause metal spiking, agglomeration, Vt-shifting, or other undesirable thermal effects. Additionally, the use of a pre-silicide layer can form $NiSi_2$ silicide regions without using a dopant implant, and can have a lower contact resistance compared to $NiSi_2$ silicide regions formed using a dopant implant technique. A capping layer (e.g., Ti or TiN layer) may be formed over the silicide material prior to annealing, which can reduce oxidation and improve contact resistance. Additionally, the $NiSi_2$ formed using the techniques described herein can have a faceted shape which provides larger surface area and reduces resistance. In some cases, silicide alloy regions (e.g., a $TiSi_x$ region) may be formed over the $NiSi_2$ regions, which can provide additional protection and thermal stability.

In an embodiment, a device includes a fin extending from a semiconductor substrate, a gate stack over and along a sidewall of the fin, an isolation region surrounding the gate stack, an epitaxial source/drain region in the fin and adjacent the gate stack, and a source/drain contact extending through the isolation region, including a first silicide region in the epitaxial source/drain region, the first silicide region including $NiSi_2$, a second silicide region on the first silicide region, the second silicide region including $TiSi_x$, and a conductive material on the second silicide region. In an embodiment, the first silicide region has a greater proportion of $NiSi_2$ than NiSi. In an embodiment, the first silicide region has a faceted triangular shape. In an embodiment, the first silicide region extends into the epitaxial source/drain region a distance between 40 Å and 200 Å. In an embodiment, the first silicide region is free of carbon (C) or argon (Ar) dopants. In an embodiment, the second silicide region extends into the epitaxial source/drain region a distance between 15 Å and 80 Å. In an embodiment, the first silicide region extends laterally under the isolation region. In an embodiment, the first silicide region laterally surrounds the second silicide region.

In an embodiment, a semiconductor device includes a dielectric layer over a semiconductor region, a contact plug in the dielectric layer, the contact plug including a conductive material surrounded by a liner material, a first silicide region in the semiconductor region, the first silicide region including a silicide of a first metal, and wherein the contact plug extends through the dielectric layer to physically contact the first silicide region, and a second silicide region in the semiconductor region, the second silicide region including a silicide of a second metal, wherein the second metal is different from the first metal, and wherein the first silicide region physically contacts the second silicide region. In an embodiment, the semiconductor region is an epitaxial source/drain region of a FinFET. In an embodiment, the FinFET is a p-type FinFET. In an embodiment, the first metal is nickel (Ni). In an embodiment, the silicide of the first metal is $NiSi_2$. In an embodiment, the second metal is titanium (Ti). In an embodiment, the first silicide region has facets.

In an embodiment, a method includes depositing a dielectric layer over a semiconductor region, patterning an opening in the dielectric layer, the opening exposing the semiconductor region, depositing a first metal layer on the semiconductor region, the first metal layer including a first metal, depositing a second metal layer on the first metal layer, the second metal layer including a second metal that is different from the first metal, and performing a first annealing process to react a portion of the semiconductor region below the first metal layer with the second metal of the second metal layer to form a silicide of the second metal in the semiconductor region. In an embodiment, the first metal layer includes titanium (Ti). In an embodiment, the second metal layer includes nickel (Ni). In an embodiment, the first annealing process includes a Rapid Thermal Anneal at a temperature between 300° C. and 500° C. In an embodiment, the method further includes, after performing the first annealing process, performing an etching process to remove unreacted portions of the first metal layer and the second metal layer, and performing the etching process, performing a second annealing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a fin extending from a semiconductor substrate;
    a gate stack over and along a sidewall of the fin;
    an isolation region surrounding the gate stack;
    an epitaxial source/drain region in the fin and adjacent the gate stack; and
    a source/drain contact extending through the isolation region, the source/drain contact comprising:
        a first silicide region in the epitaxial source/drain region, the first silicide region comprising $NiSi_2$;
        a second silicide region on the first silicide region, the second silicide region comprising $TiSi_x$, wherein the first silicide region is disposed between the second silicide region and the epitaxial source/drain region, wherein a top surface of the first silicide region is disposed above a bottom surface of the second silicide region, and wherein the first silicide region is disposed between the gate stack and the second silicide region; and
        a conductive material on the second silicide region.

2. The device of claim 1, wherein the first silicide region comprises a greater proportion of $NiSi_2$ than NiSi.

3. The device of claim 1, wherein the first silicide region has a faceted triangular shape.

4. The device of claim 1, wherein the first silicide region extends into the epitaxial source/drain region a distance between 40Å and 200Å.

5. The device of claim 1, wherein the first silicide region is free of carbon (C) or argon (Ar) dopants.

6. The device of claim 1, wherein the second silicide region extends into the epitaxial source/drain region a distance between 15Å and 80Å.

7. The device of claim 1, wherein the first silicide region extends laterally under the isolation region.

8. The device of claim 1, wherein the first silicide region laterally surrounds the second silicide region.

9. A semiconductor device comprising:
a dielectric layer over a semiconductor region in a substrate, wherein the semiconductor region is a different material from a material of the substrate;
a channel region in the substrate, wherein the channel region is in contact with the semiconductor region;
a gate structure over the channel region;
a contact plug in the dielectric layer, the contact plug comprising a conductive material surrounded by a liner material;
a first silicide region in the semiconductor region, the first silicide region comprising a silicide of a first metal, and wherein the contact plug extends through the dielectric layer to physically contact the first silicide region; and
a second silicide region in the semiconductor region, the second silicide region comprising a silicide of a second metal, wherein the second metal is different from the first metal, wherein the first silicide region physically contacts the second silicide region, wherein the first silicide region completely separates the contact plug from the second silicide region, wherein the second silicide region is disposed between the channel region and the first silicide region, the second silicide region extends along sidewalls of the first silicide region, wherein a first unsilicided portion of the semiconductor region extends along an outermost sidewall of the second silicide region in a cross-sectional view, and wherein the first unsilicided portion of the semiconductor region is disposed between the gate structure and the first silicide region in the cross-sectional view.

10. The semiconductor device of claim 9, wherein the semiconductor region is an epitaxial source/drain region of a FinFET.

11. The semiconductor device of claim 10, wherein the FinFET is a p-type FinFET.

12. The semiconductor device of claim 9, wherein the first metal is titanium (Ti).

13. The semiconductor device of claim 9, wherein the second metal is nickel (Ni).

14. The semiconductor device of claim 13, wherein the silicide of the second metal is $NiSi_2$.

15. The semiconductor device of claim 9, wherein the second silicide region has facets.

16. A semiconductor device comprising:
an isolation region over an epitaxial source/drain region;
a channel region beside and in contact with the epitaxial source/drain region;
a gate structure over the channel region;
a first dielectric layer over the isolation region;
a contact plug extending through the first dielectric layer and the isolation region, the contact plug comprising a conductive material surrounded by a liner material;
a first silicide region in the epitaxial source/drain region, the first silicide region comprising titanium (Ti), wherein the contact plug is in direct contact with the first silicide region; and
a second silicide region in the epitaxial source/drain region, the second silicide region comprising nickel (Ni), wherein the second silicide region is in direct contact with a bottom and sidewalls of the first silicide region, wherein an unsilicided portion of the epitaxial source/drain region remains unsilicided, wherein the unsilicided portion extends between the second silicide region and the gate structure along a line parallel to a top surface of the channel region, wherein the unsilicided portion extends between the first silicide region and the gate structure along the line parallel to the top surface of the channel region, and wherein the first silicide region completely separates the contact plug from the second silicide region.

17. The semiconductor device of claim 16, wherein the first silicide region comprises $NiSi_2$ and NiSi, and wherein $NiSi_2$ is greater in quantity than NiSi.

18. The semiconductor device of claim 16, further comprising a second dielectric layer disposed between the isolation region and the epitaxial source/drain region, wherein the second dielectric layer is in direct contact with sidewalls of the contact plug.

19. The semiconductor device of claim 18, wherein the second dielectric layer is in direct contact with a top surface of the second silicide region.

20. The semiconductor device of claim 16, wherein the second silicide region is disposed between the first silicide region and the epitaxial source/drain region, wherein a top surface of the second silicide region is disposed above a bottom surface of the first silicide region, and wherein the second silicide region is disposed between the gate structure and the first silicide region.

* * * * *